United States Patent
Omura et al.

(10) Patent No.: US 8,525,615 B2
(45) Date of Patent: Sep. 3, 2013

(54) ELASTIC WAVE DUPLEXER HAVING A SEALING MEMBER THAT INCLUDES A RECESS

(75) Inventors: Masashi Omura, Nagaokakyo (JP);
Daisuke Miyazaki, Nagaokakyo (JP);
Ryoichi Omote, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 377 days.

(21) Appl. No.: 12/987,215

(22) Filed: Jan. 10, 2011

(65) Prior Publication Data

US 2011/0175689 A1    Jul. 21, 2011

(30) Foreign Application Priority Data

Jan. 20, 2010   (JP) ................. 2010-010281

(51) Int. Cl.
*H03H 9/70* (2006.01)
*H03H 9/72* (2006.01)

(52) U.S. Cl.
USPC .......................... 333/133; 333/193

(58) Field of Classification Search
USPC ................. 333/133, 193–196; 310/340, 348, 310/313 R, 313 B, 313 D
See application file for complete search history.

(56) References Cited

U.S. PATENT DOCUMENTS

| | | | |
|---|---|---|---|
| 6,339,365 B1 * | 1/2002 | Kawase et al. | 333/193 |
| 6,456,172 B1 * | 9/2002 | Ishizaki et al. | 333/133 |
| 7,289,008 B2 * | 10/2007 | Kuroki et al. | 333/133 |
| 7,301,421 B2 * | 11/2007 | Yokota et al. | 333/133 |
| 7,446,629 B2 * | 11/2008 | Nakamura et al. | 333/133 |
| 7,608,977 B2 * | 10/2009 | Onozawa | 310/313 R |
| 2006/0164186 A1 | 7/2006 | Stoemmer et al. | |
| 2007/0152777 A1 | 7/2007 | Bouche et al. | |
| 2010/0148890 A1 | 6/2010 | Inoue et al. | |

FOREIGN PATENT DOCUMENTS

| | | |
|---|---|---|
| EP | 0 939 485 A1 | 9/1999 |
| EP | 1 744 453 A1 | 1/2007 |
| EP | 2 131 493 A1 | 12/2009 |
| JP | 07-326928 A | 12/1995 |
| JP | 09-199983 A | 7/1997 |
| JP | 11-251866 A | 9/1999 |
| JP | 2001-257236 * | 9/2001 |
| JP | 2002-100945 A | 4/2002 |

(Continued)

OTHER PUBLICATIONS

Official Communication issued in corresponding Japanese Patent Application No. 2010-010281, mailed on Feb. 7, 2012.

(Continued)

*Primary Examiner* — Barbara Summons
(74) *Attorney, Agent, or Firm* — Keating & Bennett, LLP

(57) ABSTRACT

In an elastic wave duplexer, a reception elastic wave filter element and a transmission elastic wave filter element are flip-chip mounted to a principal surface of a substrate. A sealing member is disposed on the principal surface of the substrate to cover and seal off at least one of the reception elastic wave filter element and the transmission elastic wave filter element. The sealing member has different thicknesses between a reception-element-covering region, which faces the reception elastic wave filter element on the side opposite from the substrate with respect to the reception elastic wave filter element, and a transmission-element-covering region, which faces the transmission elastic wave filter element on the side opposite from the substrate with respect to the transmission elastic wave filter element.

9 Claims, 15 Drawing Sheets

(56) References Cited

FOREIGN PATENT DOCUMENTS

| | | | |
|---|---|---|---|
| JP | 2002-111218 A | 4/2002 |
| JP | 2003-087095 A | 3/2003 |
| JP | 2003-258162 A | 9/2003 |
| JP | 2003-297982 A | 10/2003 |
| JP | 2005-223580 A | 8/2005 |
| JP | 2005-536958 A | 12/2005 |
| JP | 2006-014100 A | 1/2006 |
| JP | 2006-141067 A | 6/2006 |
| JP | 2006-245989 A | 9/2006 |
| JP | 2006-279604 A | 10/2006 |
| JP | 2007-074727 A | 3/2007 |
| JP | 2012-182604 | * | 9/2012 |
| WO | 2008/146552 A1 | 12/2008 |
| WO | 2009/057195 A1 | 5/2009 |

OTHER PUBLICATIONS

Omura et al., "Elastic Wave Duplexer," U.S. Appl. No. 12/987,214, filed Jan. 10, 2011.

* cited by examiner

ELASTIC WAVE DUPLEXER HAVING A SEALING MEMBER THAT INCLUDES A RECESS

BACKGROUND OF THE INVENTION

1. Field of the Invention

The present invention relates to an elastic wave duplexer and more particularly to an elastic wave duplexer, which is flip-chip mounted to a substrate and which includes a transmission elastic wave filter element and a reception elastic wave filter element, both of the filter elements being sealed off.

2. Description of the Related Art

Various conventional surface acoustic (elastic) wave devices have been proposed in which surface acoustic wave elements are mounted to a substrate and are sealed off by using a sealing resin.

For example, Japanese Unexamined Patent Application Publication No. 2002-100945 discloses a surface acoustic wave device illustrated in a sectional view of FIG. 14. The disclosed surface acoustic wave device includes, as illustrated in FIG. 14, a mounting substrate 110, a surface acoustic wave element 120 mounted on the mounting substrate 110, and a sealing member 130 for air-tightly sealing off the surface acoustic wave element 120. After forming a plurality of surface acoustic wave devices on a bulk substrate 140, the surface acoustic wave devices are cut along cut positions 141 into individual devices. The mounting substrate 110 has conductor patterns 111 formed on one surface thereof. The conductor patterns 111 are extended to pass through the mounting substrate 110 and are connected to electrodes disposed on the other surface of the mounting substrate 110. The mounting substrate 110 is made of, e.g., a ceramic or a resin. The surface elastic wave element 120 includes a piezoelectric substrate 121, comb-shaped electrodes 122 and conductor patterns 123 both formed on one surface of the piezoelectric substrate 121, and bumps 124 made of, e.g., gold, and formed at ends of the conductor patterns 123. The conductor patterns 123 are electrically connected to the comb-shaped electrodes 122. The surface acoustic wave element 120 is an element utilizing surface acoustic waves generated by the comb-shaped electrodes 122, and it is used as a filter element, a resonator, etc.

The surface acoustic wave element 120 is mounted on the mounting substrate 110 such that the comb-shaped electrodes 122 and the one surface of the mounting substrate 110 are positioned to face each other while a space 133 is formed therebetween. Further, the bumps (connecting electrodes) 124 are electrically connected to the conductor patterns 111 on the mounting substrate 110 by flip-chip bonding. The sealing member 130 is made of a sealing material 150 applied so as to cover the surface acoustic wave element 120 except for the space 133 that is formed between the comb-shaped electrodes 122 and the one surface of the mounting substrate 110. The sealing material 150 is, e.g., a resin which has, before a hardening process, not only fluidity, but also viscosity at such a proper level as not allowing the resin to easily enter the space 133, and which is hardened and dried by the hardening process.

Also, Japanese Unexamined Patent Application Publication No. 2003-87095 discloses a surface acoustic wave device illustrated in FIGS. 15A and 15B. FIG. 15A is a perspective view of the surface acoustic wave device. FIG. 15B is a sectional view taken along a line A-A' in FIG. 15A. The disclosed surface acoustic wave device includes, as illustrated in FIGS. 15A and 15B, a surface acoustic wave element 201 having comb-shaped electrodes 214a and 214b, bumps 205a to 205g disposed on the surface acoustic wave element 201, a base substrate 204 electrically and mechanically connected to the surface acoustic wave element 201 through the bumps 205a to 205g, and a sealing member 202 for protecting the surface acoustic wave element 201 against mechanical stresses and environmental stresses. The surface acoustic wave element 201 is mounted to the base substrate 204 by applying ultrasonic waves to the surface acoustic wave element 201 to melt the bumps 205a to 205g, and by joining the base substrate 204 and the surface acoustic wave element 201 to each other. A surface of the surface acoustic wave element 201 on which the comb-shaped electrodes 214a and 214b are disposed is sealed off by the sealing member 202 that is coated over the base substrate 204 and the backside of the surface acoustic wave element 201. The bumps 205a to 205g are made of, e.g., gold or silver. The sealing member 202 functions as a surface protective film for the surface acoustic wave element 201. Thus, the sealing member 202 can protect the surface acoustic wave element 201 against mechanical stresses and environmental stresses. The sealing member 202 is made of, e.g., a polymeric material, such as a polyimide resin or a PP/EPR-based polymer alloy. The surface acoustic wave element 201 includes a piezoelectric substrate 203 made of, e.g., lithium tantalate or lithium niobate, the comb-shaped electrodes 214a and 214b disposed on one principal surface of the piezoelectric substrate 203, which is positioned to face the base substrate 204, and bonding pads electrically connected to the comb-shaped electrodes 214a and 214b and disposed on the same plane on which the comb-shaped electrodes 214a and 214b are disposed. In addition, the bumps 205a to 205g are connected to the bonding pads for supplying signals, etc., to the comb-shaped electrodes 214a and 214b from the base substrate 204.

When the structures illustrated in FIG. 14 and FIGS. 15A and 15B are each applied to an elastic wave duplexer including a surface acoustic wave filter element for transmission and a surface acoustic wave filter element for reception, the surface acoustic wave filter element for transmission and the surface acoustic wave filter element for reception are flip-chip mounted to a substrate and are sealed off by using a sealing resin. One principal surface of the surface acoustic wave filter element, on which comb-shaped electrodes are formed, is positioned to face the substrate, and a sealing member made of a polymeric material (resin) is coated over the other principal surface of the surface acoustic wave filter element on the side farthest away from the substrate. Direct reaching waves are generated due to capacitance that is produced on the other principal surface of the surface acoustic wave filter element with the presence of the sealing member.

More specifically, assuming, for example, a surface acoustic wave filter element 60 having two terminal pairs, i.e., input terminals 61 and 62 and output terminals 63 and 64, as illustrated in a circuit diagram of FIG. 10, there occur signals that are directly transmitted from the input terminals 61 and 62 to the output terminals 63 and 64 without passing through the surface acoustic wave filter element 60 as indicated by arrows 70 and 72 in a circuit diagram of FIG. 11. Those signals are called "direct reaching waves".

As illustrated in an equivalent circuit diagram of FIG. 12, the direct reaching waves include a component 74 attributable to mutual inductance between the input terminals 61 and 62 and the output terminals 63 and 64, a component 76 attributable to capacitive coupling between the input terminals 61 and 62 and the output terminals 63 and 64, a component 78 attributable to floating of the ground, etc.

The direct reaching waves degrade an isolation characteristic between a transmission terminal and a first reception terminal and between the transmission terminal and a second reception terminal of the elastic wave duplexer.

SUMMARY OF THE INVENTION

In view of the problems described above, preferred embodiments of the present invention provide an elastic wave duplexer that improves an isolation characteristic.

An elastic wave duplexer according to a preferred embodiment of the present invention includes a substrate, a transmission elastic wave filter element that is flip-chip mounted to a principal surface of the substrate, a reception elastic wave filter element that is flip-chip mounted to the principal surface of the substrate, and a sealing member arranged on the principal surface of the substrate to cover at least one of the transmission elastic wave filter element and the reception elastic wave filter element and to seal off at least one of the transmission elastic wave filter element and the reception elastic wave filter element. The sealing member has different thicknesses between a transmission element covering region, which faces the transmission elastic wave filter element on a side opposite from the substrate with respect to the transmission elastic wave filter element, and a reception element covering region, which faces the reception elastic wave filter element on a side opposite from the substrate with respect to the reception elastic wave filter element.

In the arrangement described above, the transmission elastic wave filter element and the reception elastic wave filter element are preferably flip-chip mounted to the same principal surface of the substrate. The sealing member just needs to be provided in at least one of the transmission element covering region and the reception element covering region so as to cover at least one of the transmission elastic wave filter element and the reception elastic wave filter element. The arrangement may be modified such that the sealing member is provided only in at least one of the transmission element covering region and the reception element covering region, and the sealing member is not provided in the other region. Stated another way, the transmission elastic wave filter element or the reception elastic wave filter element may be in a state not being sealed off by the sealing member.

With the above-described features, since the thickness of the sealing member differs between the transmission element covering region and the reception element covering region, generation of either one of a direct reaching wave component attributable to capacitance in the transmission element covering region and a direct reaching wave component attributable to capacitance in the reception element covering region can be reduced and minimized in comparison with generation of the other. It is hence possible to suppress and prevent such a phenomenon that, between input terminals and output terminals of the transmission elastic wave filter element and the reception elastic wave filter element, signals are directly transmitted without passing through the transmission elastic wave filter element and the reception elastic wave filter element. As a result, a high degree of isolation can be realized between a transmission terminal and a first reception terminal and between the transmission terminal and a second reception terminal of the elastic wave duplexer.

Preferably, the thickness of the sealing member is smaller in the reception element covering region than in the transmission element covering region. Such a feature is particularly effective, for example, when the reception elastic wave filter element is a balanced filter.

Preferably, the elastic wave duplexer further includes a lower dielectric-constant portion that is preferably made of a second dielectric material having a lower dielectric constant than a first dielectric material used to form the sealing member, the lower dielectric-constant portion being disposed in the reception element covering region when the thickness of the sealing member is smaller in the reception element covering region than in the transmission element covering region, and being disposed in the transmission element covering region when the thickness of the sealing member is larger in the reception element covering region than in the transmission element covering region. With such a feature, the thickness of the elastic wave duplexer can be made uniform.

Preferably, the thickness of the sealing member is smaller than the thickness of the lower dielectric-constant portion in the transmission element covering region or the reception element covering region in which the lower dielectric-constant portion is provided. Such a feature is effective in realizing a high degree of isolation because it is possible to minimize the capacitance generated in the transmission element covering region or the reception element covering region in which the lower dielectric-constant portion is provided.

Preferably, the lower dielectric-constant portion is in contact with the reception elastic wave filter element on a side thereof that is located oppositely from the substrate or with the transmission elastic wave filter element on a side thereof that is located oppositely from the substrate. With such a feature, since the sealing member having a relatively large dielectric constant faces the transmission elastic wave filter element or the reception elastic wave filter element through the lower dielectric-constant portion having a relatively small dielectric constant, the capacitance generated in the transmission element covering region or the reception element covering region is reduced in comparison with that generated when the sealing member is in contact with the transmission elastic wave filter element or the reception elastic wave filter element. Thus, the relevant feature is effective in realizing a high degree of isolation.

Preferably, the second dielectric material is a resin. In such a case, the lower dielectric-constant portion can be easily formed.

In one preferred embodiment of the present invention, the transmission elastic wave filter element and the reception elastic wave filter element are defined by different chip elements. In such a case, the elastic wave duplexer can be defined by two or more chip elements.

In another preferred embodiment of the present invention, the transmission elastic wave filter element and the reception elastic wave filter element are integrated into a single chip element. In such a case, a process of mounting the chip element to the substrate is simplified.

Preferably, the reception elastic wave filter element is a balanced filter element. In such a case, the isolation characteristic can be improved by reducing the thickness of the sealing member in a region above the balanced filter element, to thereby suppress and prevent the generation of capacitance and to reduce the direct reaching wave component.

The elastic wave duplexer according to each of the preferred embodiments of the present invention improves the isolation characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Elastic wave duplexers according to preferred embodiments of the present invention will be described below with reference to FIGS. 1 to 9, 12 and 13.

First Preferred Embodiment

An elastic wave duplexer 10 according to a first preferred embodiment is described with reference to FIGS. 1 and 2.

Figure 1:
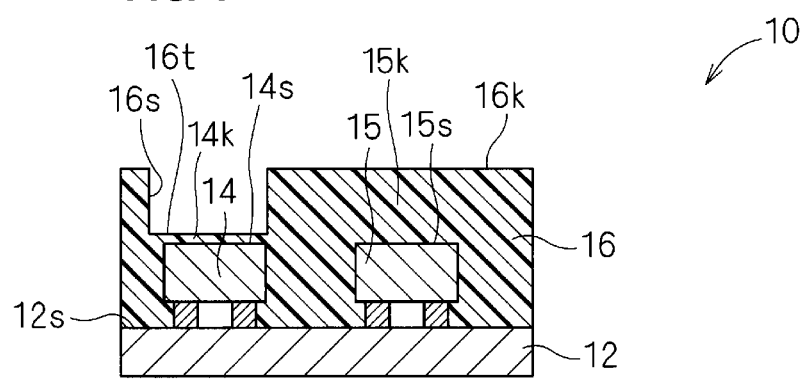
FIG. 1 is a sectional view of an elastic wave duplexer according to a first preferred embodiment of the present invention.

FIG. 1 is a sectional view of the elastic wave duplexer 10. In the elastic wave duplexer 10, as illustrated in FIG. 1, two chip elements, i.e., a reception elastic wave filter element 14 and a transmission elastic wave filter element 15, are mounted to an upper surface 12s, i.e., one principal surface, of a substrate 12 by flip-chip bonding, and the two chip elements 14 and 15 are sealed off by a sealing member 16.

The sealing member 16 is preferably made of a first dielectric material, such as a resin, and is preferably arranged over the upper surface 12s of the substrate 12 so as to cover both the reception elastic wave filter element 14 and the transmission elastic wave filter element 15. A recess 16s is formed in an upper surface 16k of the sealing member 16 on the side opposite from the substrate 12. The recess 16s is arranged such that its bottom surface 16t faces an upper surface 14s of the reception elastic wave filter element 14.

Stated another way, the sealing member 16 has different thicknesses between a reception element covering region 14k, which faces the reception elastic wave filter element 14 on the side opposite from the substrate 12 with respect to the reception elastic wave filter element 14, and a transmission element covering region 15k, which faces the transmission elastic wave filter element 15 on the side opposite from the substrate 12 with respect to the transmission elastic wave filter element 15. More specifically, the sealing member 16 has a smaller thickness in the reception element covering region 14k than that in the transmission element covering region 15k.

A method of manufacturing the elastic wave duplexer 10 will be described below with reference to FIG. 2. FIG. 2 is a sectional view to explain a manufacturing process of the elastic wave duplexer.

Figure 2:
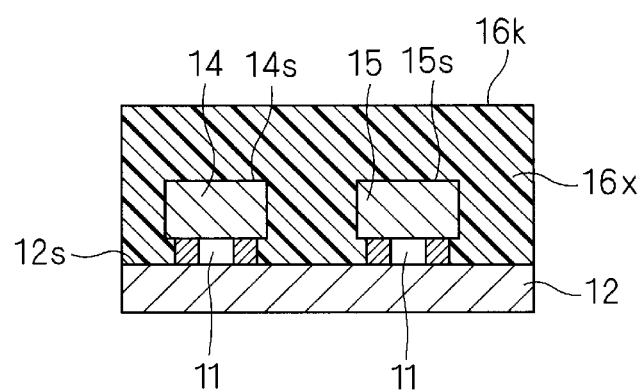
FIG. 2 is a sectional view to explain a manufacturing process of the elastic wave duplexer according to the first preferred embodiment of the present invention.

First, as illustrated in FIG. 2, the two chip elements, i.e., the reception elastic wave filter element 14 and the transmission elastic wave filter element 15, are mounted to the upper surface 12s of the substrate 12, such as a ceramic substrate, by flip-chip bonding, and a not-yet-hardened sheet of resin 16x made of the first dielectric material is overlaid so as to cover the chip elements 14 and 15. The sheet of resin 16x is overlaid by applying, in a sheet shape, a resin which has, before a hardening process, not only fluidity, but also viscosity that is sufficient to not allow the resin to easily enter a space 11 between the substrate 12 and each of the chip elements 14 and 15, and which is hardened and dried by the hardening process.

Then, the recess 16s is formed in an upper surface 16k of the sheet of resin 16x at a position substantially facing the reception elastic wave filter element 14. The recess 16s can be formed, for example, by a method of partially removing the sheet of resin 16x by, e.g., grinding after the sheet of resin 16x has been hardened by the hardening process. However, the method of forming the recess 16s is not limited to any particular one. As an alternative method, the sheet of resin 16x may be hardened after the recess 16s has been formed through the steps of providing a projection on a surface of a pressing jig to press the sheet of resin 16x, the jig being used for press-bonding the sheet of resin 16x to the substrate 12, and of pressing the projection to bite into the upper surface 16k of the sheet of resin 16x.

Manufactured Example

Figure 7:
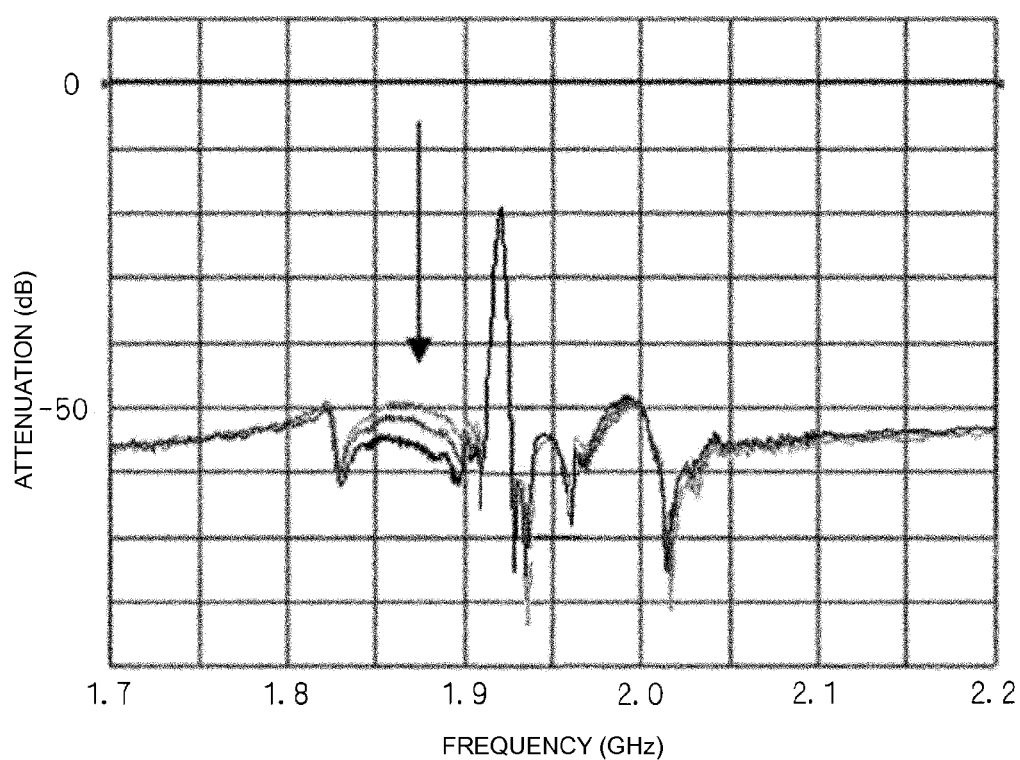
FIG. 7 is a graph illustrating an isolation characteristic according to a manufactured example of a preferred embodiment of the present invention.
Figure 8:
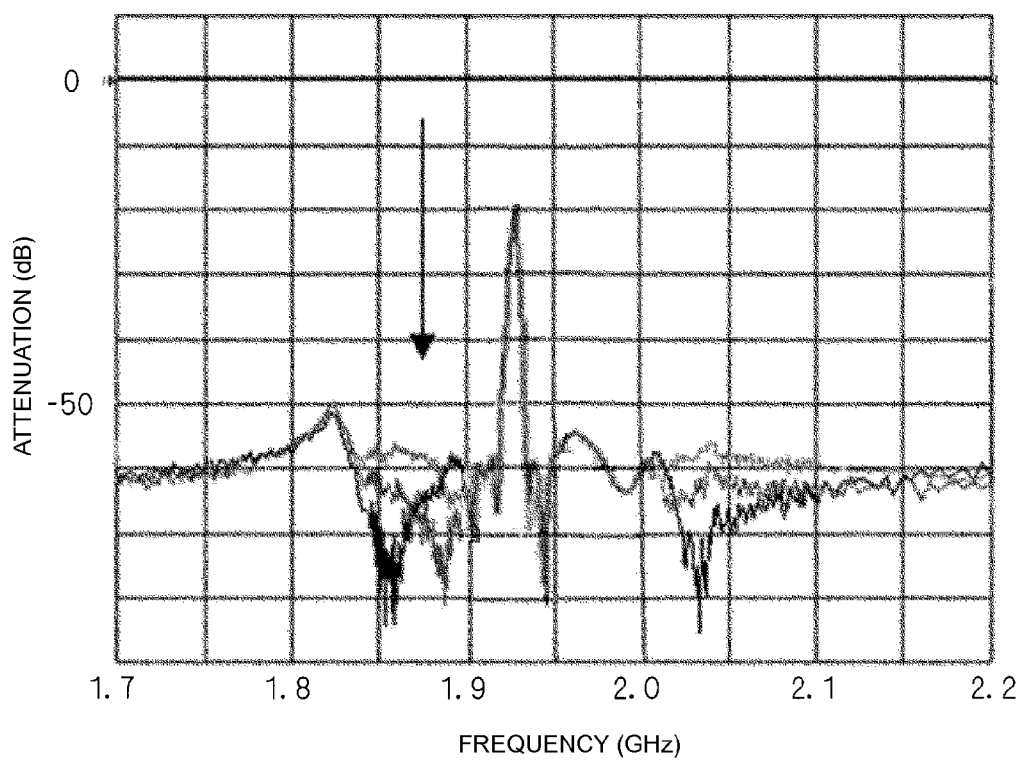
FIG. 8 is a graph illustrating an isolation characteristic according to a manufactured example of a preferred embodiment of the present invention.
Figure 9:
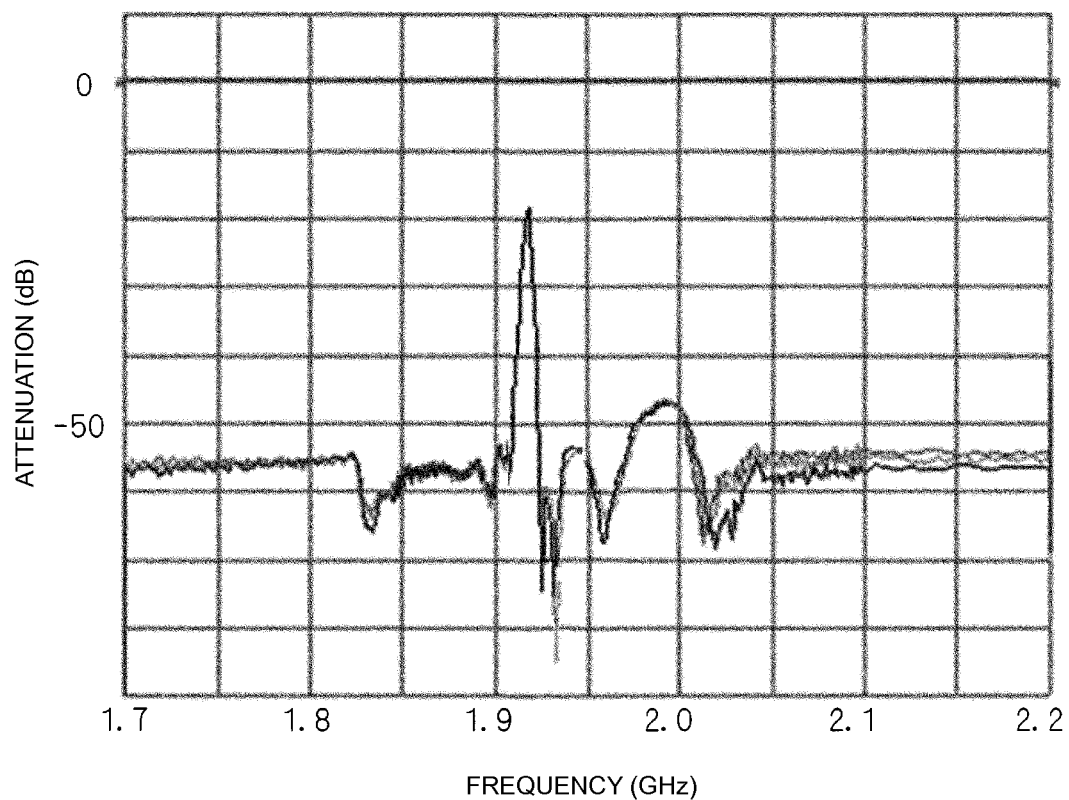
FIG. 9 is a graph illustrating an isolation characteristic according to a manufactured example of a preferred embodiment of the present invention.
Figure 10:
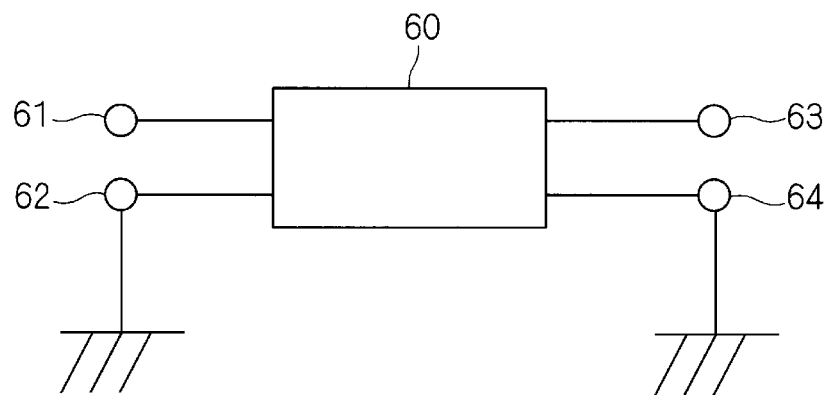
FIG. 10 is a diagram of a circuit including two terminal pairs.
Figure 11:
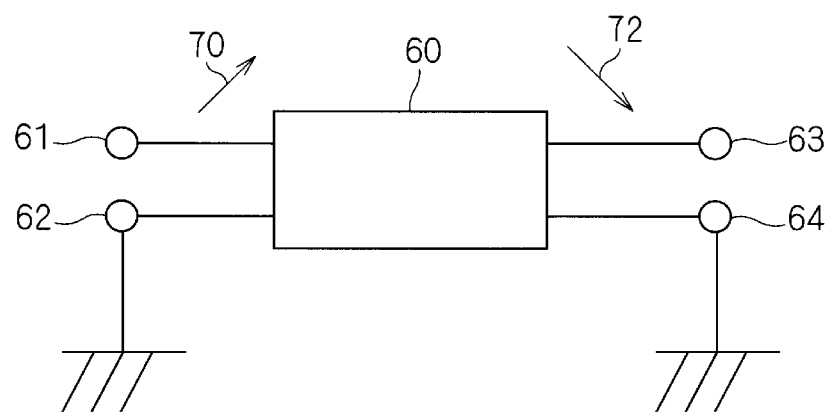
FIG. 11 is an illustration to explain components of direct reaching waves.

FIGS. 7 to 9 are each a graph illustrating an isolation characteristic of a manufactured example of the electric wave duplexer.

In the manufactured example, a ladder-type surface acoustic wave filter element is used as the transmission elastic wave filter element. A balanced filter element formed by longitudinally coupling surface acoustic wave resonators is preferably used as the reception elastic wave filter element, for example. The reception elastic wave filter element operates at a higher frequency than the transmission elastic wave filter element.

Figure 13:
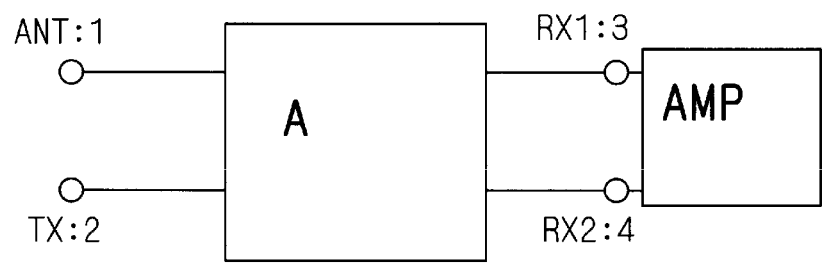
FIG. 13 is a circuit diagram of a balanced type duplexer.
Figure 14:
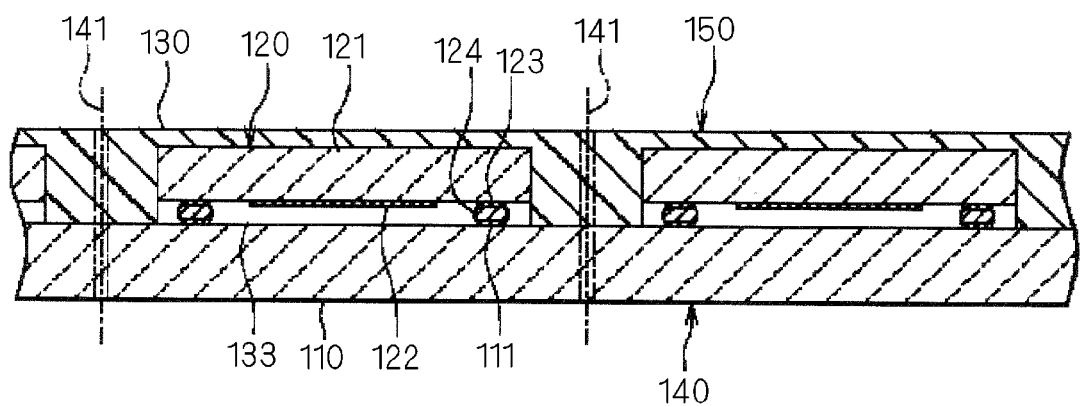
FIG. 14 is a sectional view of a conventional surface acoustic wave device.
Figure 15A:
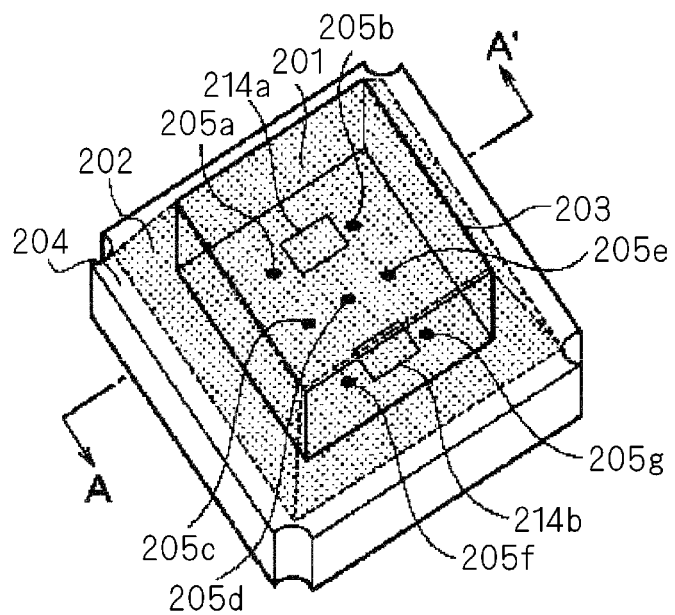
FIGS. 15A and 15B are respectively a perspective view and a sectional view of a conventional surface acoustic wave device.
Figure 15B:
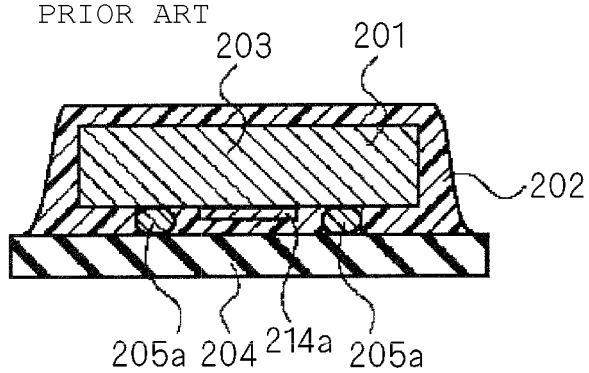

The manufactured example of the elastic wave duplexer is of the balanced type and preferably includes total four ports ANT, TX, RX1 and RX2 as illustrated in a circuit diagram of FIG. 13, for example. RX1 and RX2 are opposite in phase relative to each other. The balanced RX ports RX1 and RX2 are connected to an amplifier AMP. An isolation characteristic is usually represented by an attenuation occurred in a path from the TX port to the balanced RX port. Characteristics in the single-end mode are represented by S32 and S42 among 4-port S parameters before balance conversion. More specifically, S32 corresponds to TX-RX1, and S42 corresponds to TX-RX2. FIG. 7 illustrates attenuation in terms of S32. FIG. 8 illustrates attenuation in terms of S42. FIG. 9 illustrates a differential characteristic. Further, FIGS. 7 to 9 illustrate characteristics when the depth of the recess 16s is changed by varying an amount by which the sheet of resin 16x is ground.

As indicated by an arrow in each of FIGS. 7 and 8, it is understood that as the sheet of resin 16x is ground in a larger amount to increase the depth of the recess 16s, namely as the thickness of the sealing member 16 in the reception element covering region 14k is reduced, the attenuation is increased on the lower frequency side than a pass band and the isolation characteristic is improved.

Figure 12:
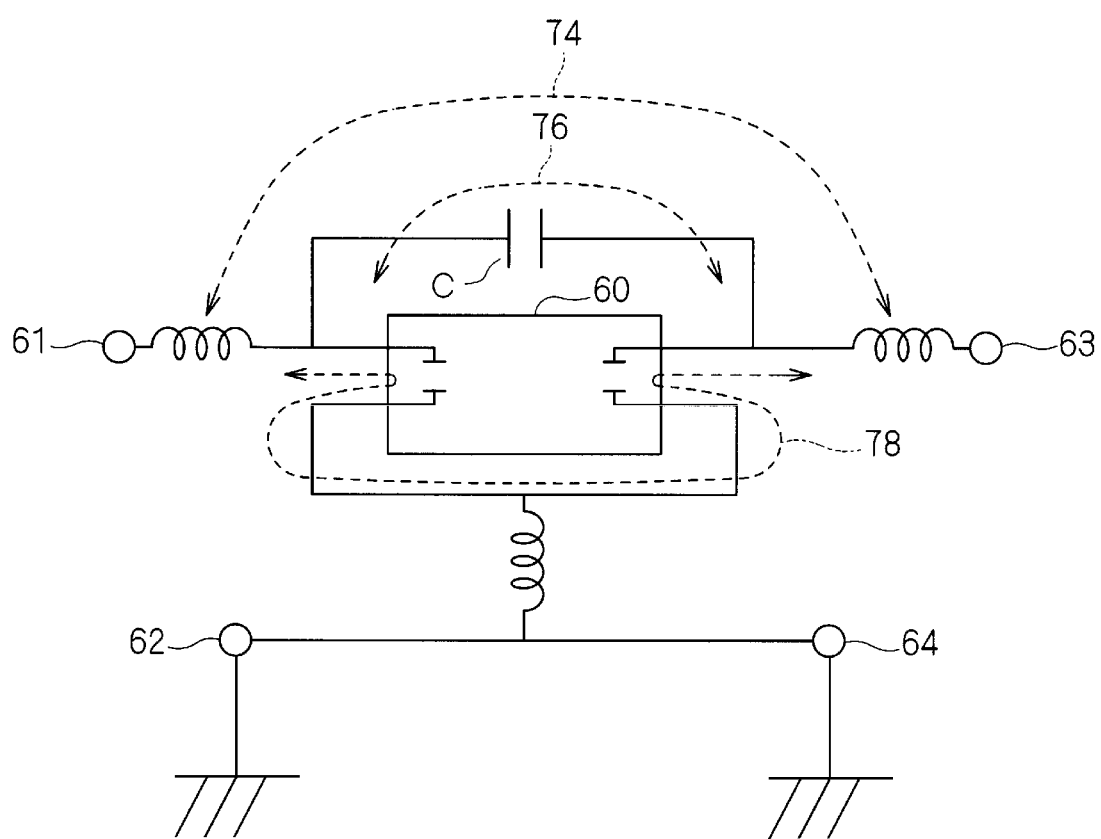
FIG. 12 is an equivalent circuit diagram to explain degradation in attenuation.

As a result of considering and analyzing the influence of a capacitance C attributable to the direct reaching waves, which causes the component 76 due to the capacitive coupling between the input terminals 61 and 62 and the output terminals 63 and 64 in the equivalent circuit model of FIG. 12, similar isolation characteristics to those illustrated in FIGS. 7 and 8 are obtained. Thus, it is understood that the isolation characteristic can be improved by reducing the capacitance C attributable to the direct reaching waves.

Stated another way, looking at the lower-frequency side isolation characteristic on the balanced side of the elastic wave duplexer in the single-end mode, capacitance is generated due to a leakage from the substrate and hence a parasitic capacitance is generated between ANT-RX, thus causing a direct reaching wave component. The larger the thickness of the resin forming the sealing member and the higher the dielectric constant thereof, the larger is the direct reaching wave component. Therefore, the direct reaching wave component can be reduced and the isolation characteristic can be improved by reducing the thickness of the sealing member in the region above the chip element and by suppressing the generation of the capacitance.

FIG. 9 illustrates the isolation characteristic in the differential mode. In the balanced-type elastic wave duplexer, degradation in the isolation characteristic is not caused in the differential mode as a result of mutual cancellation of the generated components in terms of balanced characteristic. However, degradation in the isolation characteristic appears in the common mode or the single-end mode.

In the equivalent circuit model of FIG. 12, the isolation characteristic can be improved with any structure capable of reducing the capacitance C. In particular, the resulting improvement is most effective in the isolation characteristic of the balanced filter in the lower-frequency-side transmission band.

Thus, in the elastic wave duplexer, the direct reaching wave component is generated through the sealing member provided in the region above the chip element. The generated direct reaching wave component is equivalent to the coupling due to the capacitance C. The coupling due to the capacitance C can be decreased by reducing the dielectric constant of the sealing member provided in the region above the chip element. Hence, the isolation characteristic can be improved.

However, if the thickness of the sealing member 16 in the transmission element covering region 15k is reduced in addition to reducing the thickness of the sealing member 16 in the reception element covering region 14k, the attenuation in the reception-side band is rather degraded in some cases. To avoid such an unintended degradation, the isolation characteristic can be optimized by making the thickness of the sealing member 16 different between the reception element covering region 14k and the transmission element covering region 15k.

In the manufactured example of the elastic wave duplexer, the isolation characteristic can be optimized, for example, by setting the thickness of the sealing member 16 in the reception element covering region 14k to be smaller than that of the sealing member 16 in the transmission element covering region 15k. The reception elastic wave filter element 14 operates at a higher frequency than the transmission elastic wave filter element 15 in the manufactured example of the elastic wave duplexer.

As long as the elastic wave duplexer has a structure capable of reducing the capacitance causing the direct reaching waves, it is possible to improve the isolation characteristic in other types of elastic wave duplexers as well than the balanced type.

Further, the advantage of improving the isolation characteristic can be obtained with structures described in the following second to fifth preferred embodiments because those structures can also reduce the capacitance causing the direct reaching waves.

Second Preferred Embodiment

Figure 3:
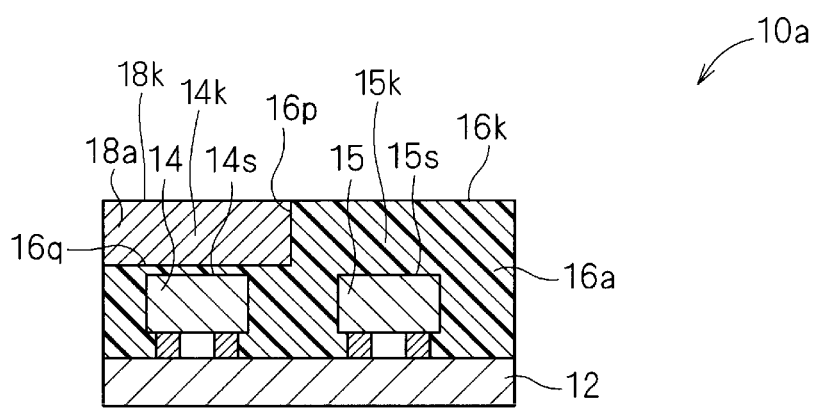
FIG. 3 is a sectional view of an elastic wave duplexer according to a second preferred embodiment of the present invention.

An elastic wave duplexer 10a according to a second preferred embodiment will be described with reference to FIG. 3. FIG. 3 is a sectional view of the elastic wave duplexer 10a.

As illustrated in FIG. 3, the elastic wave duplexer 10a according to the second preferred embodiment is constructed substantially similarly to the elastic wave duplexer 10 according to the first preferred embodiment. In the following, different points from the first preferred embodiment are primarily described and similar components to those in the first preferred embodiment are denoted by the same reference characters.

In the elastic wave duplexer 10a according to the second preferred embodiment, a cutout 16p is formed in a sealing member 16a. The cutout 16p is formed such that its bottom surface 16q faces at least a portion of the upper surface 14s of the reception elastic wave filter element 14.

A lower dielectric-constant portion 18a is provided in the cutout 16p and is preferably made of a second dielectric material that has a lower dielectric constant than the first dielectric material defining the sealing member 16a.

Between the lower dielectric-constant portion 18a and the chip element 14, there is interposed a layer of the sealing member 16a, which layer is thinner than the lower dielectric-constant portion 18a. In other words, the thickness of the lower dielectric-constant portion 18a (i.e., the dimension between an upper surface 18k of the lower dielectric-constant portion 18a and the bottom surface 16q of the cutout 16p) is larger than the thickness of the sealing member 16a in the reception element covering region 14k above the chip element 14 (i.e., the dimension between the bottom surface 16q of the cutout 16p and the upper surface 14s of the chip element 14).

The lower dielectric-constant portion 18a can be formed in the cutout 16p by a method of, for example, coating or printing the second dielectric material. As an alternative method, the lower dielectric-constant portion 18a may be formed in the cutout 16p by pressing a member serving as the lower dielectric-constant portion 18a to bite into a not-yet hardened sheet of resin, which serves as the sealing member 16a, such that the cutout 16p in the sealing member 16a and the sealing member 16a are formed at the same time, and then hardening the sheet of resin.

Preferably, the upper surface 18k of the lower dielectric-constant portion 18a is preferably arranged to be flush with the upper surface 16k of the sealing member 16a. With such a feature, since the thickness of the elastic wave duplexer 10a becomes uniform, the elastic wave duplexer 10a can be easily handled, for example, when it is transported or mounted.

In the reception element covering region 14k, the thickness of the sealing member 16a is preferably smaller than that of the lower dielectric-constant portion 18a. Such a feature can minimize the capacitance generated in the reception element covering region 14k, and hence the relevant feature is effective in realizing a high degree of isolation.

Third Preferred Embodiment

Figure 4:
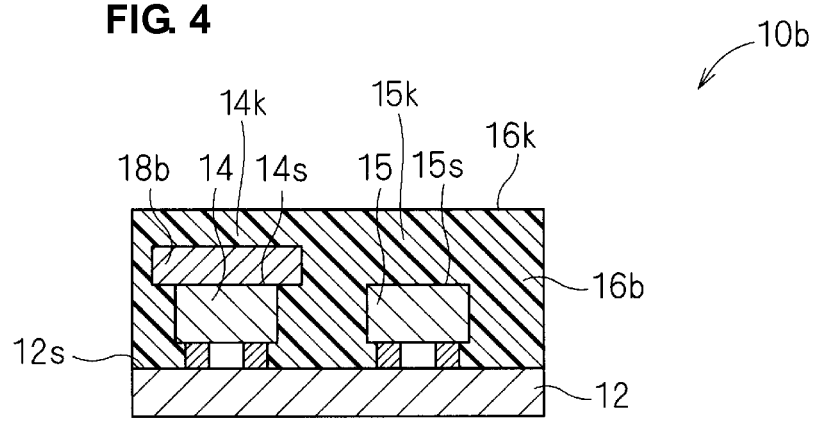
FIG. 4 is a sectional view of an elastic wave duplexer according to a third preferred embodiment of the present invention.

An elastic wave duplexer 10b according to a third preferred embodiment will be described with reference to FIG. 4. FIG. 4 is a sectional view of the elastic wave duplexer 10b.

In the elastic wave duplexer 10b according to the third preferred embodiment, as illustrated in FIG. 4, a lower dielectric-constant portion 18b is arranged in contact with the upper surface 14s of the chip element 14. While the lower dielectric-constant portion 18b is covered with the sealing member 16b in FIG. 4, a portion of the lower dielectric-constant portion 18b may be exposed to the upper surface 16k of the sealing member 16b. As a modification, the sealing member 16b may be arranged such that it is not present on the reception element covering region 14k.

The elastic wave duplexer 10b is preferably manufactured, by way of example, as follows.

First, a sheet of resin is overlaid on the upper surface 12s of the substrate 12 on which the chip elements 14 and are flip-chip mounted, and on respective upper surfaces of both the chip elements. Then, a through-hole is formed in the sheet of resin to cause the upper surface 14s of the chip element 14 to be exposed, and the second dielectric material is filled in the through-hole to form the lower dielectric-constant portion 18b. Thereafter, another sheet of resin is overlaid on the above-mentioned sheet of resin. Thus, the sealing member 16b is preferably formed by two sheets of resin in the third preferred embodiment.

As an alternative, a member serving as the lower dielectric-constant portion 18b may be disposed on the upper surface 14s of the chip element 14 which is flip-chip mounted to the substrate 12, and a sheet of resin may be then overlaid thereon.

Since the lower dielectric-constant portion 18b is disposed directly on the reception elastic wave filter element 14, an effective dielectric constant in the reception element covering region 14k can be reduced in comparison with the case where the sealing member is interposed between the lower dielectric-constant portion 18b and the reception elastic wave filter element 14, whereby the generated capacitance can be reduced. As a result, such an arrangement is effective in realizing a high degree of isolation.

Further, with an upper surface of the elastic wave duplexer 10b defined only by the upper surface 16k of the sealing member 16b, it is easier to make the thickness of the elastic wave duplexer 10b uniform.

Fourth Preferred Embodiment

An elastic wave duplexer 10c according to a fourth preferred embodiment will be described with reference to FIG. 5.

Figure 5:
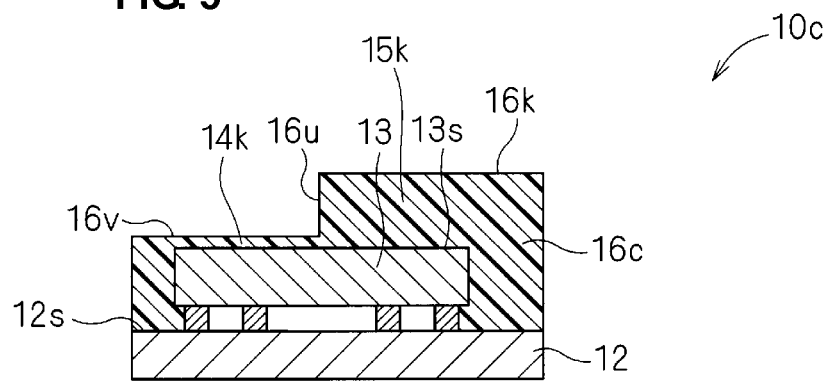
FIG. 5 is a sectional view of an elastic wave duplexer according to a fourth preferred embodiment of the present invention.

FIG. 5 is a sectional view of the elastic wave duplexer 10c. As illustrated in FIG. 5, the elastic wave duplexer 10c according to the fourth preferred embodiment is constructed such that a chip element 13 mounted to the substrate 12 is sealed off by a sealing member 16c, as in the elastic wave duplexer 10 according to the first preferred embodiment.

In the elastic wave duplexer 10c according to the fourth preferred embodiment, unlike the first preferred embodiment, the transmission elastic wave filter element and the reception elastic wave filter element are preferably integrated into a single chip element 13.

A cutout 16u is preferably formed in an upper surface 16k of a sealing member 16c. The cutout 16u is formed in a reception element covering region 14k that faces a portion of the chip element 13 where the reception elastic wave filter element is provided in the chip element 13, but it is not formed in a transmission element covering region 15k that faces a portion of the chip element 13 where the transmission elastic wave filter element is provided in the chip element 13.

In the elastic wave duplexer 10c, the thickness of the sealing member 16c in the reception element covering region 14k is smaller than that of the sealing member 16c in the transmission element covering region 15k. In other words, the thickness of the sealing member 16c in the reception element covering region 14k (i.e., the dimension between a bottom surface 16v of the cutout 16u and an upper surface 13s of the chip element 13) is smaller than the thickness of the sealing member 16c in the transmission element covering region 15k (i.e., the dimension between the upper surface 16k of the sealing member 16c and the upper surface 13s of the chip element 13).

With such an arrangement, the isolation characteristic of the elastic wave duplexer 10c can be improved as in the first preferred embodiment.

Fifth Preferred Embodiment

Figure 6:
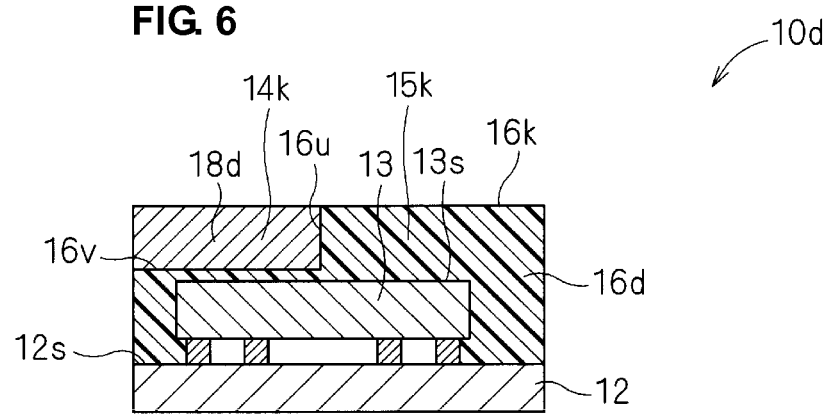
FIG. 6 is a sectional view of an elastic wave duplexer according to a fifth preferred embodiment of the present invention.

An elastic wave duplexer 10d according to a fifth preferred embodiment will be described with reference to FIG. 6. FIG. 6 is a sectional view of the elastic wave duplexer 10d.

As illustrated in FIG. 6, the elastic wave duplexer 10d according to the fifth preferred embodiment is constructed substantially similarly to the elastic wave duplexer 10c according to the fourth preferred embodiment.

In the elastic wave duplexer 10d according to the fifth preferred embodiment, a lower dielectric-constant portion 18d is provided in the cutout 16u of the sealing member 16d and is preferably made of the second dielectric material that has a lower dielectric constant than the first dielectric material forming the sealing member 16d.

Further, in the elastic wave duplexer 10d, the lower dielectric-constant portion 18d is disposed above at least one of the reception elastic wave filter element and the transmission elastic wave filter element, which are preferably integrated into the single chip element 13. With such an arrangement, an effective dielectric constant can be reduced and hence the isolation characteristic can be improved.

When both the reception elastic wave filter element and the transmission elastic wave filter element are integrated into the single chip element, the lower dielectric-constant portion may be arranged to contact with the chip element as in the third preferred embodiment.

A high degree of isolation can be realized between a transmission terminal and a first reception terminal and between the transmission terminal and a second reception terminal of an elastic wave duplexer by making the thickness of the sealing member different between the transmission element covering region, which faces the transmission elastic wave filter element on the side opposite from the substrate with respect to the transmission elastic wave filter element, and the reception element covering region, which faces the reception elastic wave filter element on the side opposite from the substrate with respect to the reception elastic wave filter element.

The present invention is not limited to the above-described preferred embodiments and can be carried out with various modifications.

For example, the lower dielectric-constant portion may be provided in both the reception element covering region and the transmission element covering region and preferably made of the second dielectric material that has a lower dielectric constant than the first dielectric material used to form the sealing member.

The transmission elastic wave filter element and the reception elastic wave filter element included in the elastic wave duplexer are not limited to filter elements utilizing surface acoustic waves (SAW), and may be filter elements utilizing other types of elastic waves, such as boundary waves and bulk elastic waves.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave duplexer comprising:
   a substrate;
   a transmission elastic wave filter element that is flip-chip mounted to a principal surface of the substrate;
   a reception elastic wave filter element that is flip-chip mounted to the principal surface of the substrate; and
   a sealing member arranged on the principal surface of the substrate to cover at least one of the transmission elastic wave filter element and the reception elastic wave filter element flip-chip mounted to the principal surface of the substrate, which seals off at least one of the transmission elastic wave filter element and the reception elastic wave filter element; wherein
   the sealing member includes a recess provided either in a transmission-element-covering region which faces the transmission elastic wave filter element on a side opposite from the substrate with respect to the transmission elastic wave filter element, or in a reception-element-covering region which faces the reception elastic wave filter element on a side opposite from the substrate with respect to the reception elastic wave filter element, such that the transmission-element-covering region and the reception-element-covering region have different thicknesses.

2. The elastic wave duplexer according to claim 1, wherein the thickness of the sealing member is smaller in the reception element covering region than in the transmission element covering region.

3. The elastic wave duplexer according to claim 1, further comprising a lower dielectric-constant portion that is made of a second dielectric material having a lower dielectric constant than that of a first dielectric material used to form the sealing member, the lower dielectric-constant portion being disposed in the reception element-covering-region when the thickness of the sealing member is smaller in the reception-element-covering region than in the transmission-element-covering region, and being disposed in the transmission-element-covering region when the thickness of the sealing member is larger in the reception-element-covering region than in the transmission-element-covering region.

4. The elastic wave duplexer according to claim 3, wherein the thickness of the sealing member is smaller than that of the lower dielectric-constant portion in the transmission-element-covering region or the reception-element-covering region in which the lower dielectric-constant portion is provided.

5. The elastic wave duplexer according to claim 3, wherein the lower dielectric-constant portion is in contact with the reception elastic wave filter element on a side thereof that is located opposite from the substrate or with the transmission elastic wave filter element on a side thereof that is located opposite from the substrate.

6. The elastic wave duplexer according to claim 3, wherein the second dielectric material is a resin.

7. The elastic wave duplexer according to claim 1, wherein the transmission elastic wave filter element and the reception elastic wave filter element are respectively defined by different chip elements.

8. The elastic wave duplexer according to claim 1, wherein the transmission elastic wave filter element and the reception elastic wave filter element are integrated into a single chip element.

9. The elastic wave duplexer according to claim 1, wherein the reception elastic wave filter element is a balanced filter element.

* * * * *